(12) United States Patent
Sweeney et al.

(10) Patent No.: US 8,431,831 B2
(45) Date of Patent: Apr. 30, 2013

(54) BOND STRENGTH AND INTERCONNECTION IN A VIA

(75) Inventors: Michael Francis Sweeney, Portland, OR (US); Jorge Eduardo Martinez-Vargas, Jr., San Francisco, CA (US); Michael Clifford Freda, Morgan Hill, CA (US)

(73) Assignee: Oracle America, Inc., Redwood City, CA (US)

( * ) Notice: Subject to any disclaimer, the term of this patent is extended or adjusted under 35 U.S.C. 154(b) by 492 days.

(21) Appl. No.: 12/247,577

(22) Filed: Oct. 8, 2008

(65) Prior Publication Data

US 2010/0084178 A1    Apr. 8, 2010

(51) Int. Cl.
*H05K 1/11* (2006.01)
*H01K 3/10* (2006.01)

(52) U.S. Cl.
USPC ............ 174/262; 174/263; 174/264; 174/265; 174/266; 29/852

(58) Field of Classification Search .......... 174/262–266; 361/792–795; 29/846, 852
See application file for complete search history.

(56) References Cited

U.S. PATENT DOCUMENTS

| | | | | |
|---|---|---|---|---|
| 3,566,005 A * | 2/1971 | Shaheen | ................... | 174/262 |
| 4,278,511 A * | 7/1981 | Dugan | ................... | 205/150 |
| 4,859,806 A * | 8/1989 | Smith | ................... | 174/261 |
| 4,975,142 A * | 12/1990 | Iannacone et al. | ............... | 216/18 |
| 5,406,034 A * | 4/1995 | Frei et al. | ................... | 174/266 |
| 5,510,580 A * | 4/1996 | Shirai et al. | ................... | 174/266 |
| 5,638,598 A * | 6/1997 | Nakaso et al. | ................... | 29/852 |
| 5,666,722 A * | 9/1997 | Tamm et al. | ................... | 29/847 |
| 5,670,750 A * | 9/1997 | Lauffer et al. | ................. | 174/262 |
| 6,004,619 A * | 12/1999 | Dippon et al. | ................... | 29/852 |
| 6,181,219 B1 * | 1/2001 | Gailus et al. | ................... | 333/33 |
| 6,239,386 B1 * | 5/2001 | DiStefano et al. | ............. | 174/262 |
| 6,272,745 B1 * | 8/2001 | Kersten et al. | ................... | 29/852 |
| 6,297,458 B1 * | 10/2001 | McMillan et al. | ............. | 174/250 |
| 6,534,726 B1 * | 3/2003 | Okada et al. | ................... | 174/263 |
| 6,663,442 B1 * | 12/2003 | Helster et al. | ................. | 439/751 |
| 6,717,067 B2 * | 4/2004 | Shi et al. | ................... | 174/261 |
| 6,753,480 B2 * | 6/2004 | Maa et al. | ................... | 174/255 |
| 7,852,635 B1 * | 12/2010 | Busletta et al. | ................. | 361/784 |
| 2006/0090933 A1 * | 5/2006 | Wig et al. | ................... | 174/262 |
| 2006/0175085 A1 * | 8/2006 | Lin | ................... | 174/262 |
| 2007/0246252 A1 * | 10/2007 | Buchwalter et al. | .......... | 174/260 |
| 2008/0078572 A1 * | 4/2008 | Watanabe et al. | ............. | 174/262 |
| 2009/0166080 A1 * | 7/2009 | Matsui | ................... | 174/266 |

* cited by examiner

*Primary Examiner* — Timothy Thompson
*Assistant Examiner* — Sherman Ng
(74) *Attorney, Agent, or Firm* — Brooks Kushman P.C.

(57) ABSTRACT

A via is provided on a printed circuit board with at least one additional depression encompassing the via, such that the via passes through a portion of the depression. Solder can pool in the depression, allowing for a stronger mechanical bond and eliminating many issues with respect to a lack of coplanarity between a lead and the printed circuit board. The depression can be provided with plugged and unplugged vias, and improves the mountings associated with both.

11 Claims, 3 Drawing Sheets

BOND STRENGTH AND INTERCONNECTION IN A VIA

TECHNOLOGICAL FIELD

The illustrative embodiments generally relate to vias. More specifically, the illustrative embodiments relate to vias providing, among other things, improved bond strength and component interconnection over traditional vias.

BACKGROUND

A printed circuit board (PCB) is generally flat, and is a multi-layer board made of fibreglass with copper tracks extending between the layers of the board. The PCB includes a plurality of component holes that connect the copper tracks from one layer of the board to other layers of the board. The component holes generally extend from a top surface of the board to a bottom surface of the board. Each component hole is cylindrical and includes a constant diameter therethrough (e.g., from the top surface of the PCB to the bottom surface of the PCB). Each component hole is configured to receive a cylindrically shaped lead of an electronic component (or through-hole electrical component). Each component hole couples the lead to a corresponding track in a corresponding layer of the PCB. Solder is applied to the component hole to fixedly couple the lead of the electronic component to the corresponding track(s) of the PCB and to facilitate electrical communication therethrough.

Traditional vias consist of holes drilled through a PCB 101 as shown in cross section in FIGS. 1A and 1B. The vias may then be plugged as in FIG. 1A or unplugged as in FIG. 1B. Typically, the vias connect one layer of a PCB to another layer, for example, connecting a track 103 to another track 105.

Component leads may also be soldered to vias. In a plugged via, for example, a lead 107 may be soldered to the plugged area 109. The bond formed by the solder, however, may be weakened because of issues of coplanarity, since the lead plane may not be parallel with the PCB (and via) plane. Further, alignment of the leads may be difficult, since the lead must rest atop the via while the soldering is done. Additionally, since there is often limited space available on the surface of the PCB, only a small amount of solder may be applied, which may also lead to a weaker bond. Also, because of concerns about, for example, alignment, the vias must be of a certain size to ensure a high likelihood that the lead will be aligned with the appropriate via once soldered.

Traditional unplugged vias, such as shown in FIG. 1B, may receive larger components with pins 111 designed to be placed through the via 113. Since the pin typically occupies the majority of the space in the via, there is little room for solder to fill the via and create a strong bond. Solder may need to be applied to the side of the PCB opposite the component to ensure a complete bond, often leaving a small pile of solder exposed on the PCB and occupying valuable surface space. Also, soldering irons may have difficulty accessing the pins for soldering on tightly packed boards. Resultantly, wave soldering may need to be used, increasing thermal stress.

SUMMARY OF THE ILLUSTRATIVE EMBODIMENTS

The illustrative embodiments present vias having improved bond strength between the via and attached leads. In one or more illustrative embodiments, a secondary z-axis hole is presented in conjunction with a plugged or unplugged via, providing a spot for solder to pool and for leads to sink in.

Further, in one or more illustrative embodiments, the z-axis hole may be cylindrical and drilled with a z-axis drill. In other illustrative embodiments, the z-axis hole may take on additional shapes, and may be made with a variety of appropriate tools.

Also, in one or more illustrative embodiments, the secondary z-axis hole is provided on both ends of the via, allowing solder to be applied in the secondary z-axis hole on both sides of the PCB.

In one or more illustrative embodiments, a PCB includes a first hole having a first diameter centered about an axis and passing at least partially through a PCB to a first depth within the PCB. The PCB also includes a first depression, arranged such that the first hole passes through a portion of the first depression, wherein the first depression has a second depth within the PCB that is less than the first depth.

In one or more illustrative embodiments, a PCB includes a first plugged via having a first depth within the printed circuit board. A method for providing a secondary z-axis depression is provided that includes cutting a first depression into the first surface of the printed circuit board such that the first hole passes through a portion of the first depression, the first depression having a second depth within the printed circuit board that is less than the first depth within the printed circuit board.

BRIEF DESCRIPTION OF THE DRAWINGS

Other objects, aspects and characteristics of the illustrative embodiments will become apparent from the following detailed description of exemplary embodiments, when read in view of the accompanying drawings, in which.

DETAILED DESCRIPTION OF THE ILLUSTRATIVE EMBODIMENT(S)

The present invention is described herein in the context of particular exemplary illustrative embodiments. However, it will be recognized by those of ordinary skill that modification, extensions and changes to the disclosed exemplary illustrative embodiments may be made without departing from the true scope and spirit of the instant invention. In short, the following descriptions are provided by way of example only, and the present invention is not limited to the particular illustrative embodiments disclosed herein.

Figure 1B:
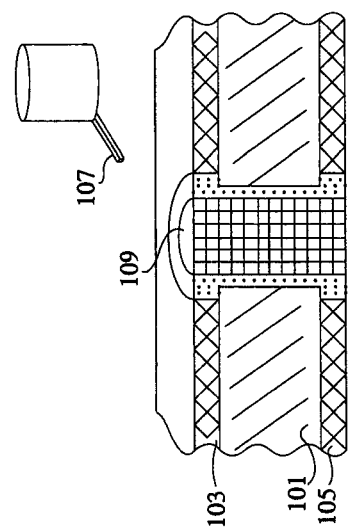
FIGS. 1A and 1B show exemplary prior art vias.
Figure 1A:
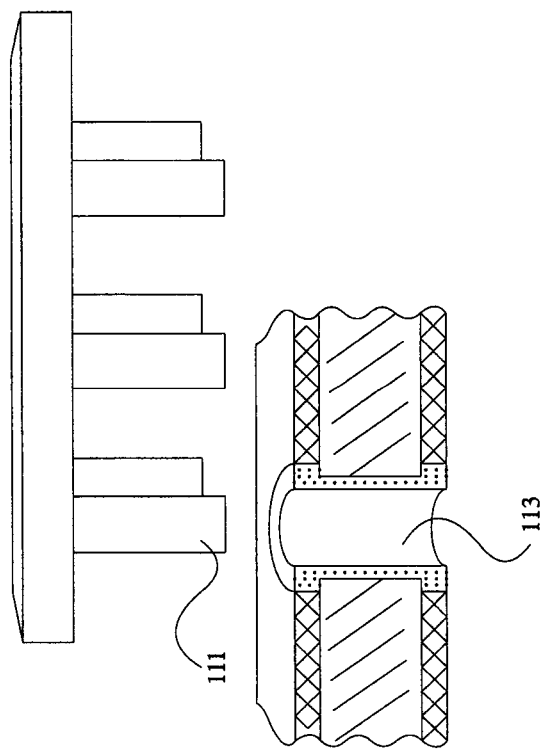
Figure 2B:
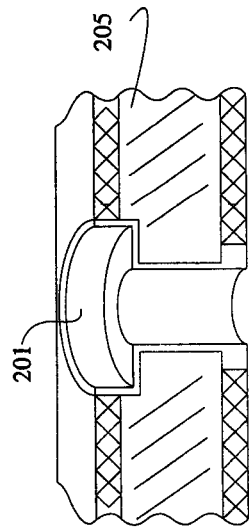
FIGS. 2A-2D shows exemplary illustrative vias having secondary z-axis holes.
Figure 2D:
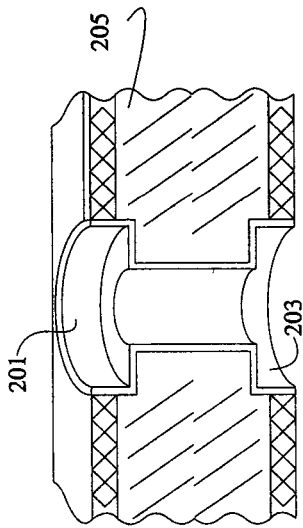
Figure 2A:
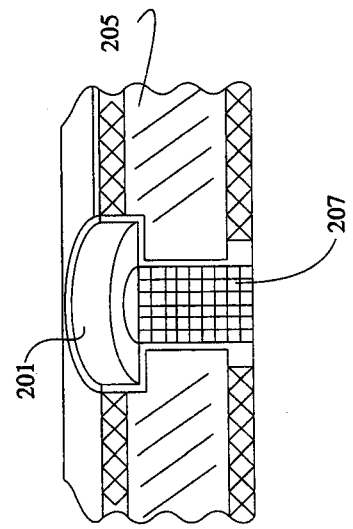

FIG. 2A shows an exemplary illustrative via having a secondary z-axis hole 201 provided thereto. In this illustrative embodiment, the z-axis hole can be created using, for example, a controlled z-axis drill from either side of the PCB 205.

This via is plugged 207, and in this illustrative embodiment the secondary z-axis hole creates a pocket 201 into which leads (not shown) can be soldered. Soldering these leads into the pocket may be done in place of the typical procedure of soldering to a flat surface pad using standard solder paste processes.

Since there is a hole 201 into which solder can pool, and since the hole may be significant in diameter compared to the via, a large volume of solder paste can pool in the hole 201. This may improve the mechanical strength of the lead connection. For example, butt joint component leads may be soldered to the via, being attached in the hole 201 filled with solder, and achieve a secure and strong mechanical connection.

Further, the illustrative embodiments may minimize the negative effects caused by a lack of coplanarity between the PCB and a lead. In traditional techniques, since leads are not always flush with the PCB, when a lead is surface soldered to the PCB, it often is not coplanar with the PCB's surface. Accordingly, the mechanical strength of the joint may be weakened. In the illustrative embodiments, the leads can sink into the solder paste that pools in the secondary z-axis hole. Then, even though there may still be planarity differences as well as X and Y deflection, the lead is more securely fastened to the via since the lead is sunk into the pooled solder. Accordingly, components are less likely to detach from the PCB.

Additionally, when leads are to be soldered to the surface of a PCB, there may be issues with aligning the leads in a traditional environment. Since the plugged via causes the PCB to maintain a relatively flat surface, it may be hard to ensure that the leads remain correctly aligned while the solder is applied. Movements could cause misalignment of the leads. In the illustrative embodiments, a standard pick and place surface mount technology (SMT) machine can be used to align the components and the leads, since the leads can drop into the secondary z-axis holes. Thus, even though plugged vias are used, a more efficient and effective method of component placement may be employed using the illustrative embodiments.

Routing can also be improved because via size in the center of the PCB can be reduced. Since the secondary z-axis holes provide a more secure and reliable means for attaching leads, the plugged vias do not need to be as large themselves. Accordingly, center layers of the PCB can be more efficiently routed around these vias since their diameter can be decreased.

Also, although the secondary z-axis holes are shown as being aligned along an axis of the via, the secondary holes could be off-center or angled as desired.

Figure 2C:
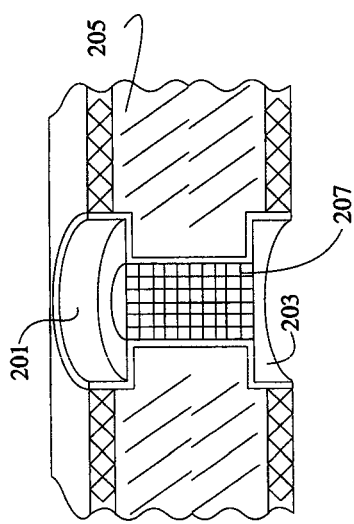

FIG. 2C shows an exemplary implementation wherein dual secondary z-axis holes 201, 203 are provided to a plugged via 207. In an exemplary implementation such as this, BGA/Interconnect devices can be soldered directly on the opposite sides of the PCB. With secondary z-axis holes on either side, the interconnects can be connected.

FIG. 2B shows an exemplary implementation of an unplugged via provided with a secondary z-axis hole 201. Again, the secondary z-axis hole 201 is drilled into the PCB 205, effectively producing an unplugged via with two diameters.

Additionally, rework process will be improved by use of the illustrative implementations. If a faulty component is installed on a PCB, there may be a need to manually or electronically remove and replace the component to ensure functionality of the circuit. When components are densely packed, a high degree of precision may be needed for this process. Since the holes provide additional area for soldering, access for soldering irons is increased, making rework easier. Such access may be important, for example, in very thick PCB's with heavy copper planes.

FIG. 2D shows an exemplary illustrative unplugged via having secondary z-axis holes 201, 203 provided to both sides thereof. Vias such as this can be used when it is desirable to create pools of solder on both sides of the unplugged via.

Figure 3A:
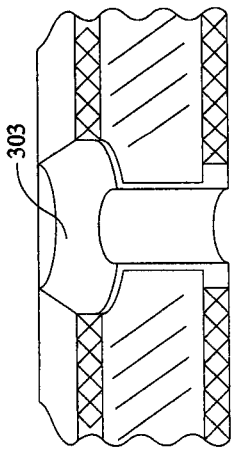
FIGS. 3A and 3B show further exemplary illustrative vias having secondary z-axis holes.
Figure 3B:
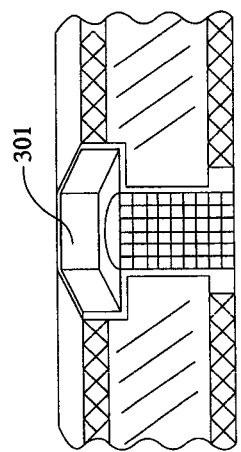

FIGS. 3A and 3B show additional exemplary implementations of vias having secondary z-axis holes provided thereto. In FIG. 3A a square hole 301 is provided. Such a hole could be made with a punch tool or other appropriate cutting tool. In FIG. 3B, a u-shaped depression 303, such as would be created by a lathe, is provided. These are just a few examples of the types of holes that could be provided in accordance with the illustrative implementations and embodiments.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A via comprising: a first hole having a first diameter centered about an axis and passing at least partially through a printed circuit board to a first depth; and a first depression, arranged such that the first hole passes through a portion of the first depression, wherein the first depression extends to a second depth that is less than the first depth, wherein the first depression further extends to at least some depth into a substrate of the printed circuit board, wherein the first hole is plugged and wherein the first depression remains unplugged, wherein the first depression is arranged on a first side of the printed circuit board, and wherein the first hole passes through a second, opposite side of the printed circuit board, further including: a second depression, arranged on the second side of the printed circuit board, such that the first hole passes through a portion of the second depression, wherein at least some portion of the first hole is arranged between the first depression and the second depression, wherein the second depression extends to at least some depth into a substrate of the printed circuit board, and wherein the second depression remains unplugged.

2. The via of claim 1, wherein the first depression further comprises a second hole having a second diameter greater than the first diameter.

3. The via of claim 1, wherein the first depression has a non-cylindrical shape.

4. The via of claim 2, wherein the first and second holes are cylindrically shaped.

5. A method of creating a via in a printed circuit board, the printed circuit board including at least one first hole about a first axis through a first surface of the printed circuit board, the first hole extending to a first depth, the method comprising: cutting a first depression into the first surface of the printed circuit board such that the first hole passes through a portion of the first depression, the first depression extending to a second depth that is less than the first depth and extending at least some depth into a substrate of the printed circuit board, wherein the first hole is plugged and wherein the first depression remains unplugged, cutting a second depression in a second surface of the printed circuit board opposite the first surface such that the first hole passes through a portion of the second depression, at such that at least a portion of the first hole remains between the first depression and the second depression, the second depression extending at least some depth into a substrate of the printed circuit board, and wherein the second depression remains unplugged.

6. The method of claim 5, wherein the cutting a first depression further comprises cutting a second hole, wherein the second hole has a diameter greater than the first hole.

7. A printed circuit board having one or more vias provided thereto, wherein the vias comprise: a first hole having a first diameter centered about an axis and passing at least partially through the printed circuit board to a first depth; a first depression, arranged such that the first hole passes through a portion of the first depression, wherein the first depression extends to a second depth that is less than the first depth, wherein the first depression further extends to at least some depth into a substrate of the printed circuit board; and a second depression, arranged on the second side of the printed circuit board, such that the first hole passes through a portion of the second depression, wherein at least some portion of the first hole is arranged between the first depression and the second depression, wherein the second depression further extends to at least some depth into a substrate of the printed circuit board, wherein the first hole is plugged and the first and second depression remain unplugged.

8. The printed circuit board of claim 7, wherein the first depression further comprises a second hole having a second diameter greater than the first diameter.

9. The printed circuit board of claim 7, wherein the first depression has a non-cylindrical shape.

10. The printed circuit board of claim 8, wherein the first and second holes are cylindrically shaped.

11. The via of claim 1, further comprising a plating coating both the first hole, the first depression, and the second depression, wherein the plating leaves at least some portion of the first hole, the first depression and the second depression unfilled and the plating further creates a complete layer between the substrate and the unfilled portions of the first hole, first depression and second depression.

* * * * *